United States Patent [19]

Lauks

[11] 4,439,464

[45] Mar. 27, 1984

[54] COMPOSITION AND METHOD FOR FORMING AMORPHOUS CHALCOGENIDE FILMS FROM SOLUTION

[75] Inventor: Imants R. Lauks, Sewell, N.J.

[73] Assignee: University Patents, Inc., Norwalk, Conn.

[21] Appl. No.: 377,222

[22] Filed: May 11, 1982

[51] Int. Cl.$^3$ .............................................. G03C 5/00
[52] U.S. Cl. ........................................ 427/76; 427/87; 427/160; 427/162; 427/240; 501/40
[58] Field of Search .................. 427/76, 87, 240, 160, 427/162; 501/40

[56] References Cited

U.S. PATENT DOCUMENTS

| 3,177,082 | 4/1965 | MacAvoy | 501/40 |
| 3,820,968 | 6/1974 | Haisty | 501/40 |
| 4,204,933 | 5/1980 | Barlow | 427/76 |
| 4,234,625 | 11/1980 | Petrov | 427/87 |
| 4,272,562 | 6/1981 | Wood | 427/87 |
| 4,371,608 | 2/1983 | Das | 430/315 |

FOREIGN PATENT DOCUMENTS 1179985  2/1970  United Kingdom ................ 427/76

OTHER PUBLICATIONS

Maruyama, "New Fabrication Techniques for Chalcogenide Semiconductors", *Amorphous Semiconductor Technologies & Devices*, pp. 255–262, 1982.

*Primary Examiner*—John D. Smith
*Attorney, Agent, or Firm*—George M. Yahwak

[57] ABSTRACT

Amorphous chalcogenide films substantially free from particulate and microstructure are formed on a substrate from solution. The solution contains a glass-forming chalcogenide compound dissolved in a non-aqueous vaporizable solvent, such as a low molecular weight amine, and is substantially free from particulate or crystallizable material. Film formation is effected by coating the solution onto the substrate in a non-vacuumized environment, and thereafter evaporating the solvent from the coating. The procedure is particularly useful in forming amorphous chalcogenide resists for photolithographic applications.

9 Claims, No Drawings

COMPOSITION AND METHOD FOR FORMING AMORPHOUS CHALCOGENIDE FILMS FROM SOLUTION

BACKGROUND OF THE INVENTION

This invention relates to amorphous chalcogenide films for use as lithographic resists and the like, and, more particularly, to novel compositions and procedures for fabricating such films on a substrate.

Amorphous chalcogenide thin films have recently found utility in a number of applications in the electronics industry. For example, the chalcogenide glasses, such as $As_2S_3$, $As_2Se_3$, Se-Ge, and other binary and ternary glassy compounds of sulphur, selenium and tellurium, are becoming increasingly important as radiation-sensitive resist materials in the lithographic fabrication of integrated circuits. The amorphous chalcogenide thin films have also been investigated for use as optical information storage media, as xerographic films, as films for ovonic memories and switches, and as anti-reflection coatings and UV-absorbing coatings for lenses and other optical systems.

In all of the various aforementioned applications, fabrication of the amorphous chalcogenide thin films on a substrate has typically been effected by vacuum deposition techniques, i.e., either by thermal evaporation or by sputtering. In addition to the relatively high cost of these techniques, vacuum deposited films generally suffer from a lack of controllable reproducibility in their stoichiometry, morphology and microstructure. Moreover, solution coating techniques have heretofore been generally avoided due to the fact that the only previously known solvents for the chalcogenides, i.e., aqueous alkalides and acids, are reactive with the chalcogenides and convert them to crystallizable compounds.

SUMMARY OF THE INVENTION

It is, accordingly, a primary object of the present invention to provide an improved method for fabricating amorphous chalcogenide films on substrates which is more convenient and economical to carry out than the currently employed vacuum deposition techniques.

Another object of the invention is to provide an improved method for fabricating amorphous chalcogenide films on substrates which enables the films to be produced with controllable reproducibility and uniformity with respect to their stoichiometry, morphology and microstructure.

A further object of the invention is to provide an improved method for fabricating amorphous chalcogenide films on substrates employing solution coating techniques.

The above and other objects are achieved in accordance with the present invention by providing amorphous chalcogenide film-forming compositions which are substantially free from particulate or crystallizable material and which comprise a glass-forming chalcogenide compound dissolved in a non-aqueous vaporizable solvent. The solutions of the present invention may be coated onto a substrate in a non-vacuumized environment to form, upon evaporation of the solvent from the coating, an amorphous chalcogenide film substantially free from particulate and microstructure. Such films can be formed in accordance with the present invention with controllable reproducibility and uniformity with respect to their stoichiometry and morphology.

DESCRIPTION OF PREFERRED EMBODIMENTS

The present invention is based upon the discovery that the glass-forming chalcogenide compounds can be dissolved in certain solvents without any substantial conversion to crystallizable compounds so as to form solutions which are substantially free from particulate or crystallizable material and which can be coated onto suitable substrates by conventional solution coating techniques to form, upon evaporation of the solvent, amorphous chalcogenide films which are substantially free from particulate and microstructure and substantially uniform in thickness and composition. All of these solvents are non-aqueous and vaporizable. A number of organic solvents, particularly low molecular weight amines, such as lower alkyl amines and lower alkylene diamines, have been found to be particularly suitable. Specific examples of such low molecular weight amines include ethylene diamine, n-propylamine, diethylamine, triethylamine, and the like. Carbon disulfide, a solvent for the elemental chalcogens, was not found to be a suitable solvent for the glass-forming chalcogenide compounds.

The foregoing solvents are capable of suitably dissolving a wide variety of glass-forming chalcogenide compounds so as to form amorphous chalcogenide film-forming compositions. By way of example, the dissolved chalcogenide compound may be any of the various Se-Ge glass-forming compounds of varying stoichiometry, as set forth in U.S. Pat. No. 4,127,414, issued Nov. 28, 1978, incorporated herein by reference. Alternatively, the dissolved chalcogenide compound may be an arsenic chalcogenide represented by the formula $As_2Z_{2+x}$, where Z is S, Se or Te, and x is an integer of from 0 to 3. Representative arsenic chalcogenide compounds include $As_2S_3$, $As_2S_2$, $As_2Se_3$, and $As_2Te_3$.

Solutions of other arsenic chalcogenides encompassed by the above formula where x is greater than 1, can be readily prepared in accordance with the present invention with controlled stoichiometry. This procedure comprises dissolving in the appropriate solvent the arsenic trichalcogenide, i.e., $As_2Z_3$, and partially oxidizing or hydrolyzing the dissolved $As_2Z_3$ to an extent sufficient to convert it to the corresponding arsenic chalcogenide compound having the desired stoichiometry and an arsenic-containing precipitate. Such conversion can suitably be effected, for example, by including a small amount of water, in the appropriately controlled concentration, in the solvent employed for dissolving the $As_2Z_3$. The arsenic-containing precipitate thereafter can be readily separated out, so as to recover the resulting supernatant containing dissolved therein the arsenic chalcogenide of the desired stoichiometry.

The concentration of glass-forming chalcogenide compound present in the amorphous chalcogenide film-forming compositions of the present invention may suitably be varied over a wide range, from very dilute up to saturated solutions, which will generally depend upon the desired thickness of the film to be deposited. For film thicknesses in the range of from about 0.2 to about 2 microns, for example, particularly suitable solutions are those in which the chalcogenide compound is present in an amount within the range of from about 1 to about 25% by weight.

The amorphous chalcogenide film-forming compositions of the present invention may suitably be coated onto a substrate, in a non-vacuumized environment, by any of the conventional solution coating techniques well known in the art, for example, by spin-on, dip-coat or spray-coat techniques. A spin-on coating technique has been found to be particularly suitable for thin film fabrication. Following the coating step, solvent evaporation from the coating may be effected either at room temperature or at elevated temperatures, e.g., up to approximately 100° C., depending upon the volatility of the solvent employed. By way of example, with ethylene diamine (having a boiling point of 116° C.) as the solvent, vacuum baking at approximately 100° C. for about 30 minutes has been found to be adequate.

The coating and evaporation steps are preferably carried out in a non-oxidizing and non-hydrolyzing environment so as to avoid conversion of the chalcogenide to a particulate or crystallizable material which would adversely affect the film properties. This may suitably be accomplished, for example, by directing a dry nitrogen spray onto the substrate surface during the coating operation, which also effectively aids solvent evaporation. In following this procedure, care should be exercised in avoiding excessive nitrogen flow so as not to produce surface rippling in the film.

The compositions and methods of the present invention may suitably be employed for fabricating amorphous chalcogenide films on a substrate for use in a wide variety of applications, such as those enumerated above. The invention is particularly useful in conveniently and economically forming radiation-sensitive amorphous chalcogenide resist materials for delineating a pattern on a substrate in the lithographic fabrication of integrated circuits. Thus, after forming the amorphous chalcogenide thin film on the substrate by means of the solution coating techniques of the present invention, a silver-containing overlayer capable of doping the amorphous chalcogenide film for enhancement of its resist properties may be coated onto the amorphous chalcogenide films, also by solution coating techniques, e.g., by dipping into an aqueous solution of silver nitrate, or by spin-on of a thin film of silver halide or silver chalcogenide from the appropriate solvent. Preferably, both the amorphous chalcogenide film and the silver-containing overlayer are applied by means of spin-on coating techniques, thereby providing an entirely spin-on inorganic resist system. The resulting resist system may then be used in the conventional manner for carrying out the remainder of the lithographic procedure, i.e., by exposing the resist system (e.g. through a mask or using a beam writing method) to a suitable source of actinic radiation (e.g., UV light, electron beams, ion beams, x-rays, or the like), dipping the exposed system into 25% aqua-regia to remove unreacted silver-containing medium, and developing in aqueous NaOH or by plasma processing.

The invention is further illustrated by way of the following examples.

EXAMPLE 1

Solutions of arsenic trisulfide were prepared from $As_2S_3$ glass powder (Servofax) and either anhydrous ethylene diamine (Analar grade reagent) or anhydrous n-propylamine. The solutions contained about 0.3 g $As_2S_3$ per ml of solvent, corresponding to approximately 25% solids. The resulting mixtures were yellow-orange in color and moderately viscous. There was no gross precipitation from these solutions, although any exposure to water either during storing or subsequent thin film fabrication caused a precipitate.

Thin films of chalcogenide glass were spun onto either 2½ inch×2½ inch glass plates for examination of homogeneity, approximately ½ inch×½ plates for UV spectrophotometry or polished high resistivity 1 inch or 2 inch diameter silicon wafers for IR spectrophotometry and X-ray diffraction as follows. Substrates were placed on the spinner. The solution of the chalcogenide was centrifuged at 3,000 rpm and/or filtered to 0.5 μm, and then pipetted onto the substrate surface and allowed to cover approximately 75%. Spinning was at 3,000 rpm, for 30 seconds. A dry nitrogen spray was directed onto the substrate surface during spinning (5 mm nozzle placed 6 inches above the substrate: 35 psi $N_2$ pressure). This procedure aided solvent evaporation and excluded $H_2O$ and $O_2$ during film deposition. The films were vacuum baked at approximately 100° C. for 30 minutes, and stored in a dessicator prior to testing.

The resulting films were 1.8 microns thick on the 2½ inch square glass plate, with less than 5% thickness variation over the entire substrate, as measured by optical interference. Visual examination showed no gross features, while optical and scanning electron microscopy indicated a microstructure-free material down to less than 0.1 micron. The films were amorphous, as shown by X-ray diffraction. IR and UV spectrophotometry indicated that the films showed absorption features similar to that of bulk $As_2S_3$ samples.

EXAMPLE 2

The procedure of Example 1 was repeated, but employing as the solvent ethylene diamine containing 8% $H_2O$. The resulting solution formed a yellow-white precipitate. X-ray powder diffraction of the precipitate indicated a complex mixture of oxy and hydroxy compounds of arsenic and organoarsenic compounds. After a few hours, the precipitation ceased, and the clear solutions were quite stable for prolonged periods of storage in a stoppered bottle. The resulting film showed properties similar to those as described in Example 1. However, the visible-UV transmission spectra indicated an absorption edge close to bulk $As_2S_5$, rather than the starting $As_2S_3$.

EXAMPLE 3

An arsenic trisulfide film deposited from ethylene diamine solution as described in Example 1 was sensitized by dipping into $10^{-3}$ M $AgNO_3$, and employed as a photolithographic resist material. This resist required 3 J cm$^{-2}$ UV exposure, which is comparable with the fastest vacuum evaporated $As_2S_3$ resists reported in the literature. While plasma etching speeds of the unexposed portions of the resist were somewhat slower than the optimum plasma etching speeds of unexposed vacuum evaporated $As_2S_3$ films reported in the literature, 1–2 micron lines and spaces were satisfactorily printed with edge sharpening effects.

I claim:

1. A method of forming an amorphous chalcogenide film on a substrate, comprising the steps of:
   (a) preparing a solution containing a glass-forming chalcogenide compound dissolved in a non-aqueous vaporizable solvent, said solution being substantially free from particulate or crystallizable material;

(b) coating said solution onto said substrate in a non-vacuumized environment; and (c) evaporating the solvent from the coating so as to form an amorphous chalcogenide film substantially free from particulate and microstructure.

2. The method of claim 1, wherein said solvent is an organic solvent.

3. The method of claim 2, wheren said solvent is a low molecular weight amine.

4. The method of claim 3, wherein said solvent is a lower alkyl amine or a lower alkylene diamine.

5. The method of claim 1, wherein said chalcogenide commpound is Se-Ge or $As_2Z_{2+x}$, where Z is S, Se or Te, and x is an integer of from 0 to 3.

6. The method of claim 5, wherein said chalcogenide compound is $As_2Z_{2+x}$, and x is greater than 1; and said solution is prepared by dissolving $As_2Z_3$ in said solvent, partially oxidizing or hydrolyzing said $As_2Z_3$ to an extent sufficient to convert it to said $As_2Z_{2+x}$ and an arsenic-containing precipitate, and recovering the resulting supernatant containing said $As_2Z_{2+x}$ dissolved therein.

7. The method of claim 6, wherein the solvent employed for dissolving said $As_2Z_3$ includes water in a concentration sufficient for effecting said conversion.

8. The method of claim 1, wherein said coating and evaporation steps are carried out in a non-oxidizing and non-hydrolyzing environment.

9. The method of claim 1, wherein said coating step is effected by means of a spin-on coating technique.

* * * * *